United States Patent
Hsu et al.

(10) Patent No.: US 9,419,093 B2
(45) Date of Patent: Aug. 16, 2016

(54) METHOD OF FORMING A HIGH ELECTRON MOBILITY TRANSISTOR

(71) Applicant: TAIWAN SEMICONDUCTOR MANUFACTURING COMPANY, LTD., Hsinchu (TW)

(72) Inventors: Chun-Wei Hsu, Taichung (TW); Jiun-Lei Jerry Yu, Zhudong Township (TW); Fu-Wei Yao, Hsinchu (TW); Chen-Ju Yu, Jiaoxi Township (TW); Po-Chih Chen, Hsinchu (TW); King-Yuen Wong, Tuen Mun (HK)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/585,758

(22) Filed: Dec. 30, 2014

(65) Prior Publication Data
US 2015/0140745 A1     May 21, 2015

Related U.S. Application Data

(62) Division of application No. 13/339,052, filed on Dec. 28, 2011, now Pat. No. 8,963,162.

(51) Int. Cl.
| | | |
|---|---|---|
| *H01L 21/338* | (2006.01) | |
| *H01L 29/66* | (2006.01) | |
| *H01L 29/267* | (2006.01) | |
| *H01L 29/43* | (2006.01) | |
| *H01L 29/778* | (2006.01) | |

(Continued)

(52) U.S. Cl.
CPC ........ *H01L 29/66462* (2013.01); *H01L 29/267* (2013.01); *H01L 29/432* (2013.01); *H01L 29/7786* (2013.01); *H01L 29/1066* (2013.01); *H01L 29/41766* (2013.01)

(58) Field of Classification Search
CPC ................ H01L 29/267; H01L 29/432; H01L 29/66462; H01L 29/7786; H01L 29/1066; H01L 29/41766; H01L 29/2003; H01L 29/778; H01L 29/7787; H01L 29/66431; H01L 27/0605; H01L 21/0254; H01L 21/02458; H01L 29/20
USPC ........................................................ 438/172
See application file for complete search history.

(56) References Cited

U.S. PATENT DOCUMENTS

| | | |
|---|---|---|
| 2004/0227154 A1 | 11/2004 | Chu et al. |
| 2005/0087763 A1 | 4/2005 | Kanda et al. |
| 2008/0258243 A1* | 10/2008 | Kuroda et al. ............... 257/410 |

(Continued)

OTHER PUBLICATIONS

Dabiran A. M., et al., "Very High Channel Conductivity in Low-Defect AlN/GaN High Electron Mobility Transistor Structures", Appl. Phys. Lett. 93, 082111 (2008); doi: 10.1063/1.2970991.

(Continued)

*Primary Examiner* — Thanh T Nguyen
(74) *Attorney, Agent, or Firm* — Haynes and Boone, LLP

(57) ABSTRACT

A method of forming a high electron mobility transistor (HEMT) includes forming a second III-V compound layer on a first III-V compound layer, forming a source feature and a drain feature on the second III-V compound layer, depositing a p-type layer on a portion of the second III-V compound layer between the source feature and the drain feature, and forming a gate electrode on the p-type layer. A carrier channel is located between the first III-V compound layer and the second III-V compound layer.

20 Claims, 10 Drawing Sheets

(51) Int. Cl.
*H01L 29/417* (2006.01)
*H01L 29/10* (2006.01)

(56) References Cited

U.S. PATENT DOCUMENTS

| | | | |
|---|---|---|---|
| 2009/0057720 A1* | 3/2009 | Kaneko | 257/194 |
| 2010/0127275 A1 | 5/2010 | Takehiko et al. | |
| 2011/0114967 A1* | 5/2011 | Hikita et al. | 257/76 |
| 2012/0086001 A1* | 4/2012 | Wang | 257/43 |
| 2012/0319169 A1* | 12/2012 | Van Hove | 257/194 |

OTHER PUBLICATIONS

Kaneko, Nobuo et al., "Normally-Offi AlGaN/GaN HFETs Using NiOx Gate with Recess", IEEE 2009, pp. 25-28.

Imada, T., et al., "Enhancement-Mode GaN MIS-HEMTs for Power Supplies", The 2010 International Power Electronics Conference, pp. 1027-1033.

Office Action dated Apr. 21, 2014 from corresponding application No. TW 101117175.

* cited by examiner

METHOD OF FORMING A HIGH ELECTRON MOBILITY TRANSISTOR

PRIORITY CLAIM

The present application is a divisional of U.S. application Ser. No. 13/339,052, filed Dec. 28, 2011, which is incorporated herein by reference in its entirety.

TECHNICAL FIELD

This disclosure relates generally to a semiconductor structure and, more particularly, to a high electron mobility transistor (HEMT) and method for forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is marked on the substrate by scribe lines between the chip regions. The substrate will go through a variety of cleaning, layering, patterning, etching and doping steps to form integrated circuits. The term "substrate" herein generally refers to the bulk substrate on which various layers and device structures are formed. In some embodiments, the bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
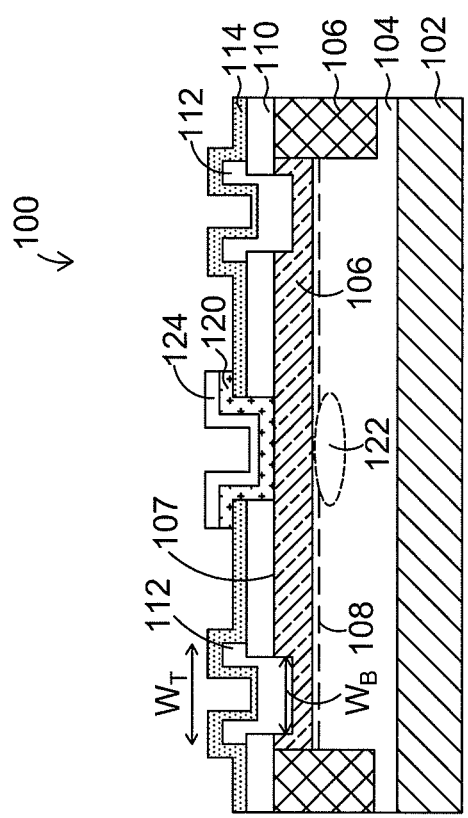
FIG. 1 is a cross-sectional view of a semiconductor structure having a high electron mobility transistor (HEMT) according to one or more embodiments of this disclosure.

FIG. 1 is a cross-sectional view of a semiconductor structure 100 having a high electron mobility transistor (HEMT) according to one or more embodiments of this disclosure.

Referring to FIG. 1, the semiconductor structure 100 having a HEMT is illustrated. The semiconductor structure 100 includes a substrate 102. In the present example, the substrate 102 includes a silicon substrate. In some embodiments, the substrate 102 includes a silicon carbide (SiC) substrate or sapphire substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In at least one embodiment, the semiconductor structure 100 includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum nitride (AlN) layer (also referred to as AlN layer 106). The GaN layer 104 and AlN layer 106 directly contact each other. In some embodiments, the channel layer 104 includes a GaAs layer or InP layer. In some embodiments, the donor-supply layer 106 includes an AlGaAs layer, AlGaN or AlInP layer.

A band gap discontinuity exists between the AlN layer 106 and the GaN layer 104. The electrons from a piezoelectric effect in the AlN layer 106 drop into the GaN layer 104, creating a very thin layer 108 of highly mobile conducting electrons in the GaN layer 104. This thin layer 108 is also referred to as a two-dimensional electron gas (2-DEG), and forms a carrier channel (also referred to as the carrier channel 108). The thin layer 108 of 2-DEG is located at an interface of the AlN layer 106 and the GaN layer 104. Thus, the carrier channel has high electron mobility because the GaN layer 104 is undoped or unintentionally doped, and the electrons can move freely without collision or with substantially reduced collisions with impurities.

The GaN layer 104 is undoped. Alternatively, the GaN layer 104 is unintentionally doped, such as lightly doped with n-type dopants due to a precursor used to form the GaN layer 104. In at least one example, the GaN layer 104 has a thickness in a range from about 0.5 microns to about 10 microns.

The AlN layer 106 is intentionally doped. In at least one example, the AlN layer 106 has a thickness in a range from about 2 nanometers (nm) to about 20 nm. Compared to other donor-supply layers such as AlGaAs layer, AlGaN layer or AlInP layer, the AlN layer 106 has a larger lattice mismatch with the GaN layer 104 than other donor-supply layers with the GaN layer. Hence, the AlN layer 106 could use a relative thin thickness to create the same concentration of 2-DEG in the carrier channel 108 as other donor-supply layers do. The thinner AlN layer helps the later formed gate electrode closer to the carrier channel 108 and improves the capability of gate control. Also, the AlN layer could reduce the electron scattering effect in the carrier channel 108 and make carrier mobility higher.

The semiconductor structure 100 also includes a dielectric cap layer 110 disposed on a top surface 107 of the AlN layer 106. The dielectric cap layer 110 further includes a plurality of openings that expose a portion of the AlN layer 106 for a gate electrode formation and source/drain features formation. The dielectric cap layer 110 protects the underlying AlN layer 106 from damage in the following process having plasma.

The semiconductor structure 100 also includes a source feature and a drain feature disposed on the second III-V compound layer 106 (e.g. AlN layer 106) and configured to electrically connect to the carrier channel 108. The second III-V compound layer 106 has a substantially flat top surface between the source feature and the drain feature. Each of the source feature and the drain feature comprises a corresponding intermetallic compound 112. In at least one example, the intermetallic compound 112 is free of Au and comprises Al, Ti, or Cu. In at least another example, the intermetallic compound 112 is free of Au and comprises AlN, TiN, Al$_3$Ti or AlTi$_2$N.

In at least one embodiment, the intermetallic compound 112 is formed in the openings of the dielectric cap layer 110, at least partially embedded in the AlN layer 106 and overlies a portion of the dielectric cap layer 110. Thereby, the intermetallic compound 112 has a non-flat top surface. The intermetallic compound 112 has a top width $W_T$ and a bottom width $W_B$. The top width $W_T$ is wider than the bottom width $W_B$.

In some embodiments, intermetallic compound 112 is partially embedded in the AlN layer 106 and does not overlie a portion of the dielectric cap layer 110. The top width $W_T$ and the bottom width $W_B$ are substantially the same.

In some embodiments, the intermetallic compound 112 is at least partially embedded in the AlN layer 106 and a top portion of the GaN layer 104. In some embodiments, the intermetallic compound 112 is formed by constructing a patterned metal layer in a recess of the AlN layer 106. Then, a thermal annealing process is applied to the patterned metal layer such that the metal layer, the AlN layer 106 and the GaN layer 104 react to form the intermetallic compound 112. The intermetallic compound 112 contacts the carrier channel 108 located at the interface of the AlN layer 106 and the GaN layer 104. Due to the formation of the recess in AlN layer 106, the metal elements in the intermetallic compound 112 diffuse deeper into the AlN layer 106 and the GaN layer 104. The intermetallic compound 112 improves electrical connection and form ohmic contacts between the source/drain features and the carrier channel 108.

The semiconductor structure 100 further includes isolation regions 116 in the first III-V compound layer 104 and the second III-V compound layer 106. The isolation regions 116 isolate the HEMT in the structure 100 from other devices in the substrate 102. In at least one example, the isolation region 116 includes a doped region with species of oxygen or nitrogen.

A protection layer 114 is disposed on top surfaces of the dielectric cap layer 110 and the intermetallic compounds 112. The protection layer 114 further includes an opening that aligns with an opening in the dielectric cap layer 110. The combined opening of the opening in the protection layer 114 and the opening in the dielectric cap layer 110 exposes a portion of the AlN layer 106 for gate electrode formation. The protection layer 114 covers the source feature and the drain feature, and protects the source/drain features from exposure during an annealing process in the formation of the isolation regions 116.

The semiconductor structure 100 further includes a p-type layer 120. The p-type layer 120 is disposed along an interior surface of the combined opening of the protection layer 114 and the dielectric cap layer 110, on the exposed portion of the AlN layer 106 and overlying a portion of the protection layer 114. In some examples, the p-type layer 120 comprises NiO$_x$, ZnO$_x$, FeO$_x$, SnO$_x$, CuAlO$_2$, CuGaO$_2$ or SrCu$_2$O$_2$. X is in a range of about 1 to about 2. The p-type layer 120 contains point defects, for example, ZnO$_x$ has Zn interstitials and oxygen vacancies. The point defects generate electron holes and induce p-type conductivity for the p-type layer 120. The p-type layer 120 depletes the electrons in the carrier channel 108 under the combined opening. In at least one example, the p-type layer 120 has a thickness in a range from about 3 nm to about 30 nm. When the thickness is less than 3 nm, the p-type layer could not deplete the carrier channel 108. It is hard to generate an enhanced-mode HEMT. When the thickness of the p-type layer is larger than 30 nm, the carrier channel 108 may be completely depleted even a high positive gate voltage is applied during operation. It is hard to turn on the carrier channel 108 of this HEMT.

In one embodiment, the p-type layer 120 further includes a plurality of dopants to induce a density of electron holes in a range of about $10^{17}$ to about $10^{19}$ per cm$^3$ within the p-type layer 120. The dopants increase p-type layer 120 toward p-type conductivity and further deplete the electrons in the carrier channel 108. In some examples, the dopants comprise phosphorous (P), P$_2$O$_5$, arsenic (As) or Zn$_3$As$_2$.

The semiconductor structure 100 also includes a gate electrode 124 disposed in the combined opening over AlN layer 106 between the source and drain features. The gate electrode 124 includes a conductive material layer configured for voltage bias and electrical coupling with the carrier channel 108. In various examples, the conductive material layer includes a refractory metal or its compounds, e.g., titanium (Ti), titanium nitride (TiN), titanium tungsten (TiW), titanium tungsten nitride (TiWN), tungsten (W) or tungsten nitride (WN). In at least another example, the conductive material layer includes nickel (Ni), gold (Au) or copper (Cu). In at least one example, the gate electrode 124 is disposed on the p-type layer 120 in the combined opening over the AlN layer 106. The p-type layer 120 not covered by the gate electrode 124 is removed to prevent depleting the electrons in the carrier channel 108 outside the gate electrode 124 region. Edges of the p-type layer 120 and the gate electrode 124 are substantially aligned.

The p-type layer 120 also acts as a gate insulator for this semiconductor structure 100. The presence of the p-type layer 120 between the gate electrode 124 and the donor-supply layer 106 constructs a metal insulator semiconductor high electron mobility transistor (MIS-HEMT). During the operation of the MIS-HEMT, the electrons flow in the carrier channel 108 between the source feature and the drain feature. In some embodiments, the electrons inject toward the gate electrode 124. The p-type layer 120 provides a higher barrier height to prevent the electrons penetrating the p-type layer 120 to the gate electrode 124. Hence, the p-type layer 120 provides further isolation to prevent gate leakage of the HEMT in the structure 100.

The semiconductor structure 100 also includes a depletion region 122 in the carrier channel 108 under the combined opening of the protection layer 114 and the dielectric cap layer 110. The carrier channel 108 becomes normally-off because of the depletion region 122. In the embodiment of FIG. 1, a positive gate voltage should be applied to turn on the carrier channel 108 of this HEMT. In the embodiment of FIG. 1, this HEMT is also called an enhanced-mode HEMT that is opposite to a depletion-mode HEMT. The depletion-mode HEMT has a normally-on carrier channel and a negative gate voltage is applied to turn off the carrier channel.

In the above described embodiments, the gate electrode 128, the source/drain features, and the carrier channel 108 in the GaN layer 104 are configured as a transistor. When a voltage is applied to the gate stack, a device current of the transistor is modulated.

Figure 2A:
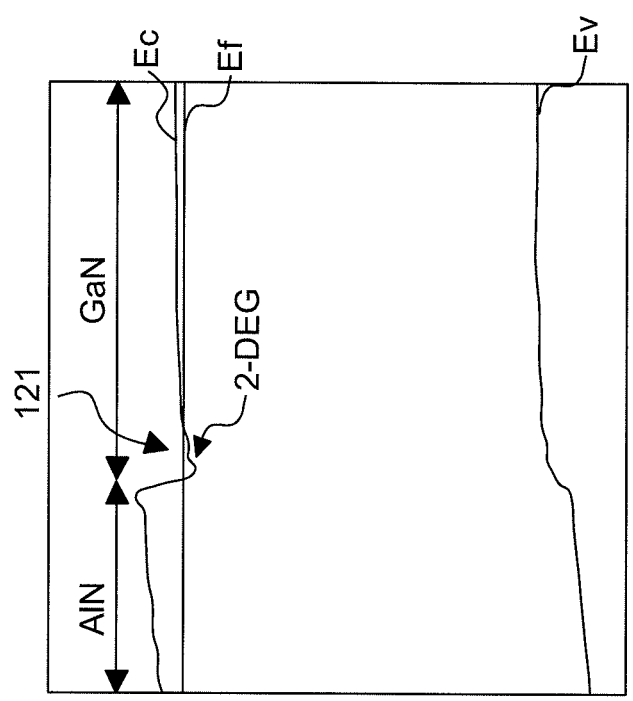
FIG. 2A shows a band gap diagram along a comparative HEMT.

FIG. 2A is a band gap diagram along a comparative HEMT having an AlN layer located directly on the top surface of a GaN layer. Conductance band $E_c$ at an interface 121 of the AlN layer and the GaN layer is lower than Fermi level $E_f$. A thin layer of 2-DEG appears at the interface 121 so a normally-on channel is constituted. This conventional HEMT is a depletion-mode HEMT.

Figure 2B:
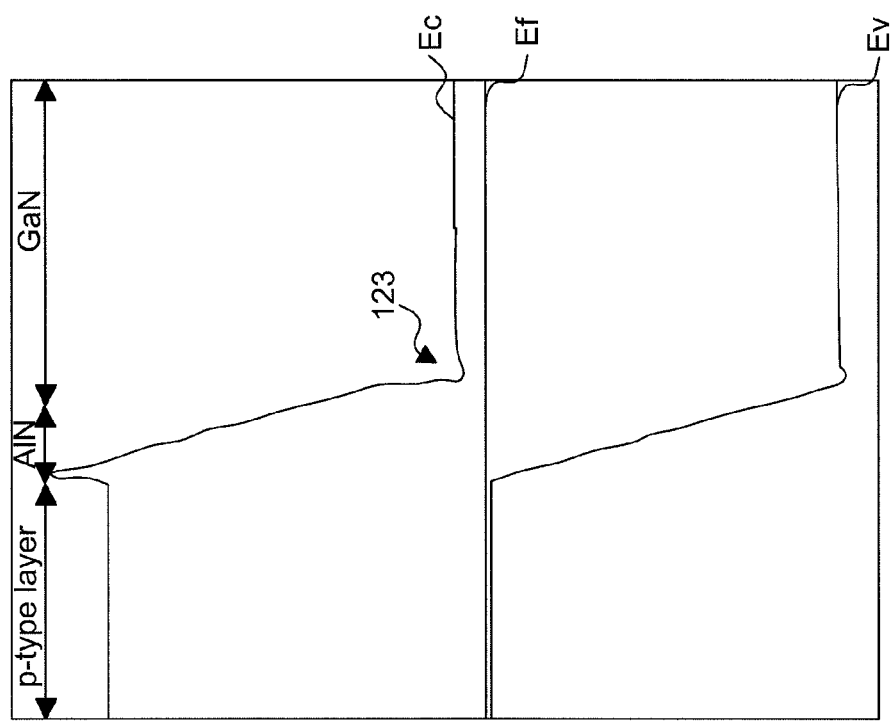
FIG. 2B shows a band gap diagram along the HEMT shown in FIG. 1.

FIG. 2B shows a band gap diagram along the HEMT of the semiconductor structure 100 shown in FIG. 1. In at least this example of the HEMT of the semiconductor structure 100, an AlN layer is on a GaN layer, and a p-type layer is directly on a top surface of the AlN layer. With the presence of the p-type layer, conductance band $E_c$ at the interface (as shown at location 123) of the AlN layer and the GaN layer is elevated in comparison with a comparative HEMT. At the interface (as shown at location 123), the conductance band $E_c$ is higher than the Fermi level $E_f$. The thin layer of 2-DEG disappears at the interface so a normally-off channel is constituted. A positive gate voltage is applied to turn on the carrier channel of this enhanced-mode HEMT.

Figure 3:
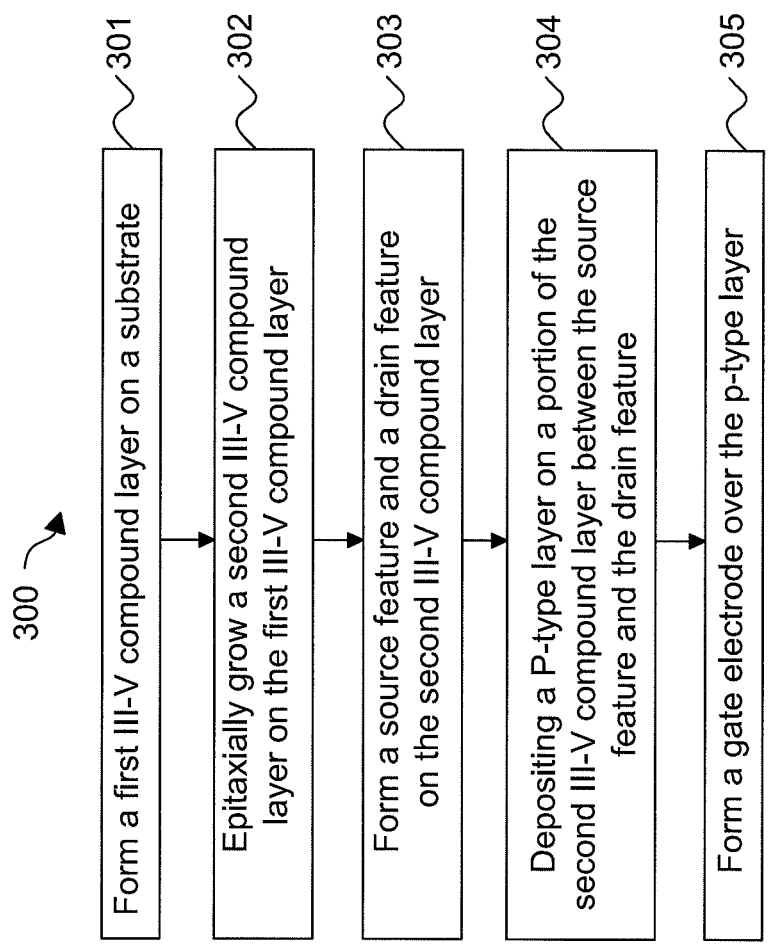
FIG. 3 is a flowchart of a method of forming a semiconductor structure having a HEMT according to one or more embodiments of this disclosure.

FIG. 3 is a flowchart of a method 300 of forming a semiconductor structure having a HEMT according to one or more embodiments of this disclosure. Referring now to FIG. 3, the flowchart of the method 300, at operation 301, a first III-V compound layer is provided. The first III-V compound layer is formed on a substrate. Next, the method 300 continues with operation 302 in which a second III-V compound layer is epitaxially grown on the first III-V compound layer. The method 300 continues with operation 303 in which a source feature and a drain feature are formed on the second III-V compound layer. The method 300 continues with operation 304 in which a p-type layer is deposited on a portion of the second III-V compound layer between the source feature and the drain feature. The method 300 continues with operation 305 in which a gate electrode is formed on the p-type layer. It should be noted that additional processes may be provided before, during, or after the method 300 of FIG. 3.

FIGS. 4 to 11 are cross-sectional views of the semiconductor structure 100 having a HEMT at various stages of manufacture according to various embodiments of the method 300 of FIG. 3. Various figures have been simplified for a better understanding of the inventive concepts of the present disclosure.

Figure 4:
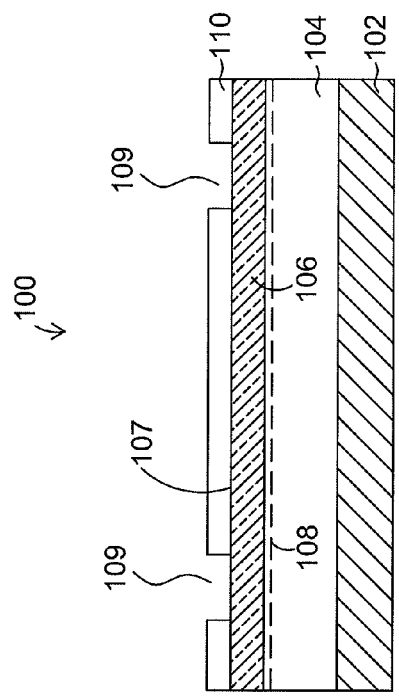
FIGS. 4 to 11 are cross-sectional views of a semiconductor structure having a HEMT at various stages of manufacture according to one or more embodiments of the method of FIG. 3.

Referring to FIG. 4, which is an enlarged cross-sectional view of a portion of a substrate 102 of a semiconductor structure 100 after performing operations 301 and 302 in method 300. In some embodiments, the substrate 102 includes a silicon carbide (SiC) substrate, sapphire substrate or a silicon substrate. A first III-V compound layer 104, also referred to as a channel layer, is formed on the substrate 102. In the embodiment of FIGS. 4-11, the first III-V compound layer 104 refers to a gallium nitride (GaN) layer (also referred to as the GaN layer 104). In some embodiments, the GaN layer 104 is epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In the embodiment of FIGS. 4-11, the GaN layer 104 has a thickness in a range from about 0.5 micron to about 10 microns. In other embodiments, the first III-V compound layer 104 may include a GaAs layer or InP layer.

A second III-V compound layer 106, also referred to as donor-supply layer, is grown on first III-V compound layer 104. An interface is defined between the first III-V compound layer 104 and the second III-V compound layer 106. A carrier channel 108 of 2-DEG is located at the interface of the first III-V compound layer 104 and the second III-V compound layer 106. In at least one embodiment, the second III-V compound layer 106 refers to an aluminum nitride (AlN) layer (also referred to as the AlN layer 106). In the embodiment of FIGS. 4-11, the AlN layer 106 is epitaxially grown on the GaN layer 104 by MOVPE using aluminum-containing precursor and nitrogen-containing precursor. The aluminum-containing precursor includes trimethylaluminum (TMA), triethylaluminium (TEA), or other suitable chemical. The nitrogen-containing precursor includes ammonia ($NH_3$), tertiarybutylamine (TBAm), phenyl hydrazine, or other suitable chemical. In the embodiment of FIGS. 4-11, the AlN layer 106 has a thickness in a range from about 2 nanometers to about 20 nanometers. In other embodiments, the second III-V compound layer 106 includes an AlGaAs layer, an AlGaN layer or an AlInP layer.

After performing operations 301 and 302, a dielectric cap layer 110 is deposited on a top surface 107 of the second III-V compound layer 106. The dielectric cap layer 110 has a thickness in a range from about 100 Å to about 5000 Å. In some embodiments, the dielectric cap layer 110 includes $SiO_2$ or $Si_3N_4$. In at least one example, the dielectric cap layer 110 is $Si_3N_4$ and is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Torr. The dielectric cap layer 110 protects the underlying second III-V compound layer 106 from damage in the following processes having plasma. Next, two openings 109 in the dielectric cap layer 110 are defined by lithography and etching processes to expose a portion of the second III-V compound layer 106.

Figure 5:
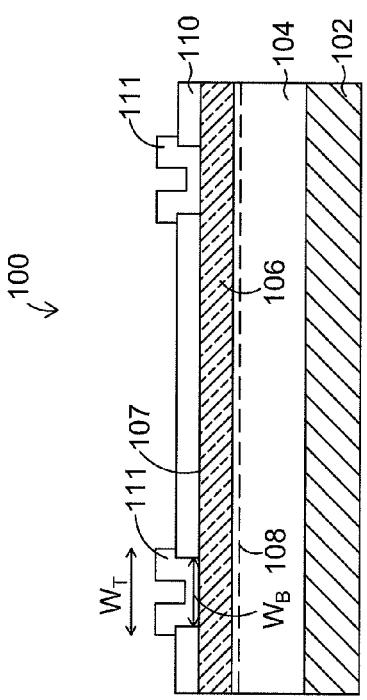
Figure 6:
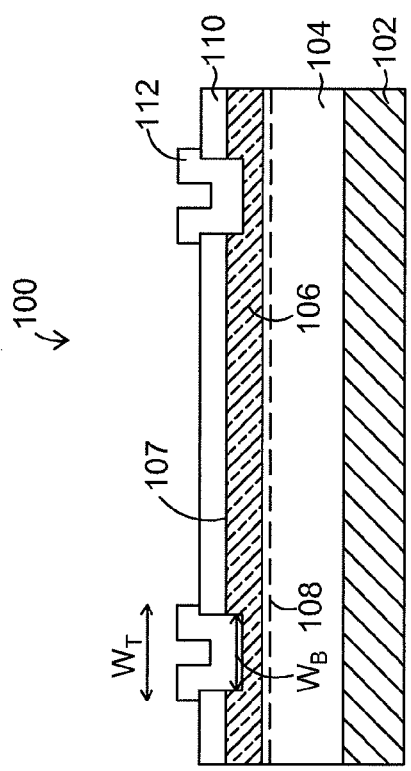

Referring back to FIG. 3, method 300 continues with operation 303. FIGS. 5 and 6 illustrate cross-sectional views for the manufacture stages for forming the source/drain features.

In FIG. 5, a metal layer is deposited over the dielectric cap layer 110, overfills the openings 109 and contacts the second III-V compound layer 106. A photoresist layer (not shown) is formed over a portion of the metal layer and developed to form a feature over the openings 109. A portion of the metal layer not covered by the feature of the photoresist layer is removed by a reactive ion etch (RIE) process that etches the exposed portions of the metal layer down to the underlying the dielectric cap layer 110. Metal features 111 are generated by the etching process. The photoresist layer is removed after the formation of the metal features 111. The dielectric cap layer 110 protects the underlying second III-V compound layer 106 from damage during the etching process to form metal features 111. The carriers in carrier channel 108 of 2-DEG underlying the second III-V compound layer 106 are not affected during this etching process. The electrical performances of the semiconductor structure 100 are positively affected. Therefore, the yield of the overall assembly increases.

In some embodiments, the metal layer of the metal features 111 includes one or more conductive materials. In at least one example, the metal layer is free of gold (Au) and comprises titanium (Ti), titanium nitride (TiN), or aluminum copper (AlCu) alloy. In at least another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. Without using Au in the metal features 111, the method 300 is also implemented in the production line of integrated circuits on silicon substrate, because the contamination concern from the use of Au on the silicon fabrication process is eliminated.

In at least one example, the metal feature 111 is formed over the interior surface of the opening 109 and over a portion of a top surface of the dielectric cap layer 110. There is a step height difference between the metal feature 111 within the opening 109 and the metal feature 111 over the dielectric cap layer 110. Hence, the metal feature 111 has a non-flat top surface. The metal feature 111 has a top width $W_T$ and a bottom width $W_B$. The top width $W_T$ is wider than the bottom width $W_B$.

In at least another example, metal feature 111 is within the opening 109 on the AlN layer 106 and does not overlie a portion of the dielectric cap layer 110. The top width $W_T$ and the bottom width $W_B$ are substantially the same.

FIG. 6 is a cross-sectional view of the semiconductor structure 100 after performing a thermal annealing process on the metal features 111. In some embodiments, the thermal annealing process is applied to the metal features 111 such that each metal feature 111, the second III-V compound layer 106 and/or the first III-V compound layer 104 react to form an intermetallic compound 112. The intermetallic compound 112 is configured as a source/drain feature for effective electrical connection to the carrier channel 108. As at least one example, a rapid thermal annealing (RTA) apparatus and process are utilized for the thermal annealing. The thermal annealing is operated at an annealing temperature in a range from about 800° C. to about 1100° C. In at least one example, the intermetallic compound 112 is free of Au and comprises Al, Ti, or Cu. In at least another example, the intermetallic compound 112 is free of Au and comprises AlN, TiN, Al$_3$Ti or AlTi$_2$N.

In at least one example, the intermetallic compound 112 is at least partially embedded in the AlN layer 106 and over the portion of the top surface of the dielectric cap layer 110. The step height difference for the intermetallic compound 112 within the opening 109 and the intermetallic compound 112 over the dielectric cap layer 110 results in a non-flat top surface for the intermetallic compound 112. The intermetallic compound 112 has a top width $W_T$ and a bottom width $W_B$. The top width $W_T$ is wider than the bottom width $W_B$.

In at least another example, the intermetallic compound 112 is partially embedded in the AlN layer 106 and does not overlie the portion of the top surface of the dielectric cap layer 110. The top width $W_T$ and the bottom width $W_B$ are substantially the same.

Figure 7:
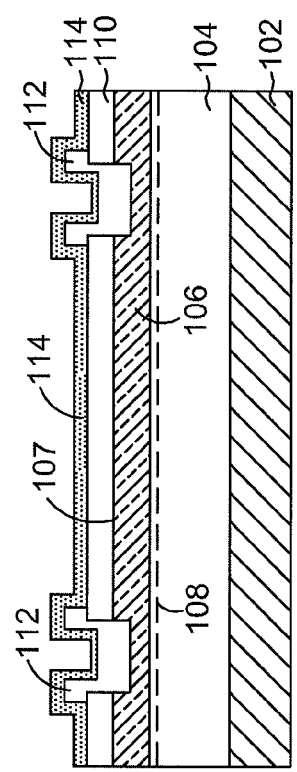

FIG. 7 is a cross-sectional view of the semiconductor structure 100 after depositing a protection layer 114 on top surfaces of the dielectric cap layer 110 and the intermetallic compounds 112. In some embodiments, the protection layer 114 includes dielectric materials such as SiO$_2$ or Si3N$_4$. In at least one example, protection layer 114 is Si3N$_4$ and is formed by a plasma enhanced chemical vapor deposition (PECVD) method. The protection layer 116 has a thickness in a range from about 100 nanometers to about 700 nanometers.

Figure 8:
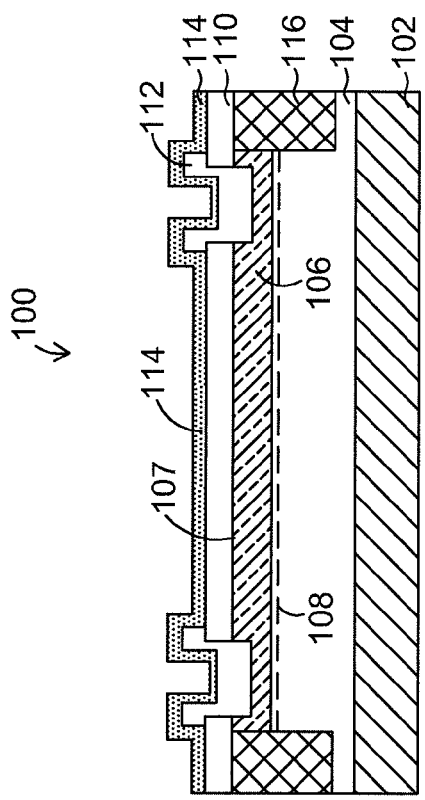

FIG. 8 illustrates the semiconductor structure 100 after forming isolation regions 116 in the first III-V compound layer 104 and the second III-V compound layer 106. The isolation regions 116 isolate the HEMT in the semiconductor structure 100 from other devices in the substrate 102. In at least one example, the isolation region 116 is formed by an implantation process with species of oxygen or nitrogen. The protection layer 114 covers the source feature and the drain feature, and prevents the source/drain features from exposure during an annealing process after the implantation process for the isolation region 116 formation.

Figure 9:
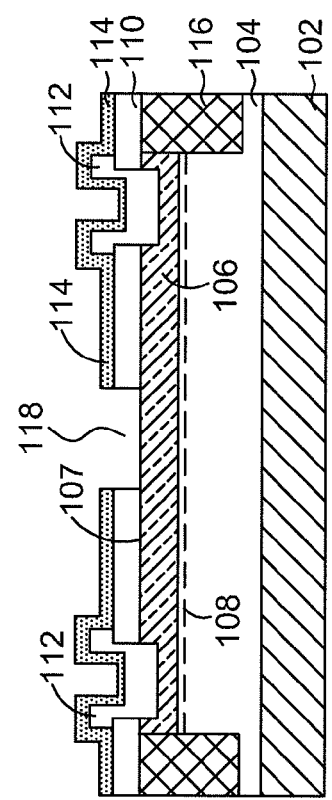

FIG. 9 illustrates the semiconductor structure 100 after forming a combined opening 118 in the protection layer 114 and the dielectric cap layer 110. A patterned mask layer (not shown) is formed on a top surface of the protection layer 114 and an etching process is performed to remove a portion of the protection layer 114 and the dielectric cap layer 110. The opening 118 exposes a portion of the top surface 107 of the second III-V compound layer 106. The exposed portion of the second III-V compound layer 106 has a substantially flat top surface between the intermetallic compounds 112. The opening 118 is configured as a location for the later gate electrode formation.

Figure 10:
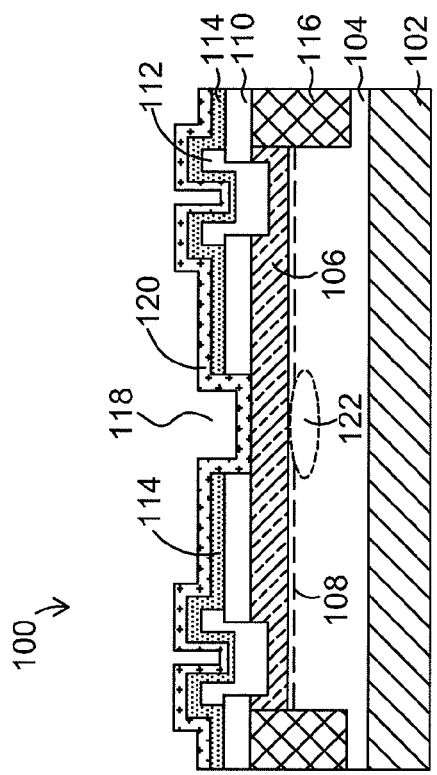

Referring back to FIG. 3, method 300 continues with operation 304. FIG. 10 illustrates a cross-sectional view for depositing a p-type layer 120 on a portion of the second III-V compound layer 106 between the source feature and the drain feature.

The p-type layer 120 is deposited on the protection layer 114, along an interior surface of the combined opening 118 and on the exposed portion of the second III-V compound layer 106. The p-type layer 120 is also deposited over the source/drain features. The p-type layer 120 has a thickness range from about 3 nm to about 30 nm. In some examples, the p-type layer 120 comprises certain metal oxides. Examples of metal oxides used for p-type layer 120 include oxides of Ni, Zn, Fe, Sn, Cu, Al, Ga, Sr and mixtures thereof. In some embodiments, the p-type layer 120 comprises NiO$_x$, ZnO$_x$, FeO$_x$, SnOx, CuAlO$_2$, CuGaO$_2$ or SrCu$_2$O$_2$. X is in a range of about 1 to about 2. In at least one example, the p-type layer 120 is NiO$_x$. A nickel layer is formed by a sputtering deposition with a nickel target. Then, an oxidation process is performed to convert the nickel layer into NiO$_x$. In other embodiments, the p-type layer 120 is formed by an atomic layer deposition (ALD) method or a plasma enhanced chemical vapor deposition (PECVD) method.

The p-type layer 120 contains point defects, for example, ZnO$_x$ has Zn interstitials and oxygen vacancies. The point defects generate electron holes and induce p-type conductivity for the p-type layer 120. The p-type layer 120 elevates the conductance band, $E_c$, at the interface (as shown at location 123) of the first III-V compound layer 104 and the second III-V compound layer 106 under the combined opening 118 to a level higher than the Fermi level, $E_f$, at the interface of the first III-V compound layer and the second III-V compound layer. The electrons in the carrier channel 108 under the combined opening 118 are depleted. Hence, a depletion region 122 in the carrier channel 108 is generated. The HEMT in the structure 100 is converted from a depletion-mode HEMT to an enhanced-mode HEMT. The carrier channel 108 becomes normally-off and a positive gate voltage is applied to turn on the carrier channel 108 of this enhanced-mode HEMT.

In at least one embodiment, the p-type layer 120 is also treated with a plurality of dopants including phosphorous (P), $P_2O_5$, arsenic (As) or $Zn_3As_2$. Next, an annealing process is performed to activate the dopants in a temperature range from about 600° C. to about 900° C. in a nitrogen environment. The dopants within the p-type layer 120 induce the density of electron holes to a range of about $10^{17}$ to about $10^{19}$ per $cm^3$. The electron holes increase p-type layer 120 toward p-type conductivity and further deplete the electrons in the depletion region 122 of the carrier channel 108.

Figure 11:
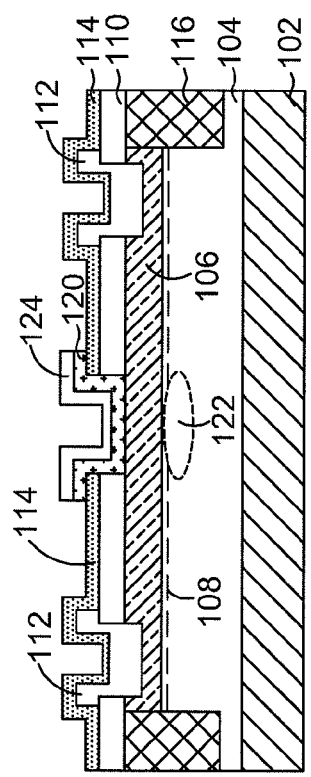

Referring back to FIG. 3, method 300 continues with operation 305. FIG. 11 illustrates a gate electrode 124 is formed over the p-type layer 120.

In at least one example, a gate electrode layer is deposited on the p-type layer 120 and overfills the combined opening 118. Lithography and etching processes are performed on the gate electrode layer to define the gate electrode 124 between the source feature and the drain feature. The p-type layer 120 not covered by the gate electrode 124 is removed to prevent depleting the electrons in the carrier channel 108 outside the gate electrode 124 region. Edges of the p-type layer 120 and the gate electrode 124 are substantially aligned. In various examples, the gate electrode layer includes a refractory metal or its compounds, e.g., titanium (Ti), titanium nitride (TiN), titanium tungsten (TiW), titanium tungsten nitride (TiWN), tungsten (W) or tungsten nitride (WN). By using the refractory metals or compounds, the method 300 can be implemented in the production line of integrated circuits on silicon substrate. The contamination concern due to unsuitable materials on the silicon-fabrication process is eliminated. In at least another example, the gate electrode layer includes nickel (Ni), gold (Au) or copper (Cu).

Figure 12:
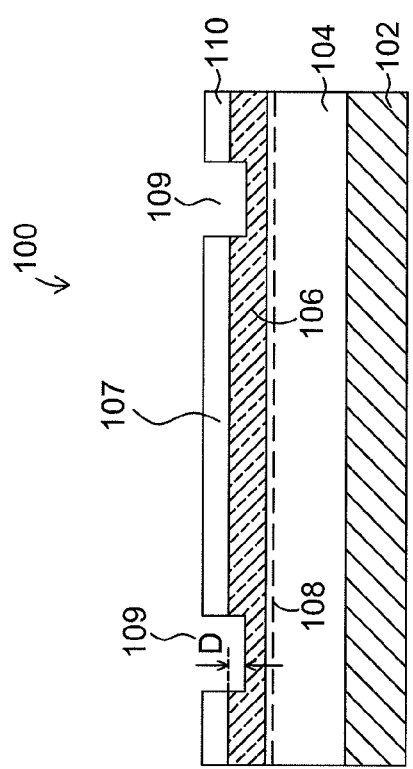
FIGS. 12 to 14 are cross-sectional views of a semiconductor structure having a HEMT at various stages of manufacture according to one or more embodiments of the method of FIG. 3.
Figure 13:
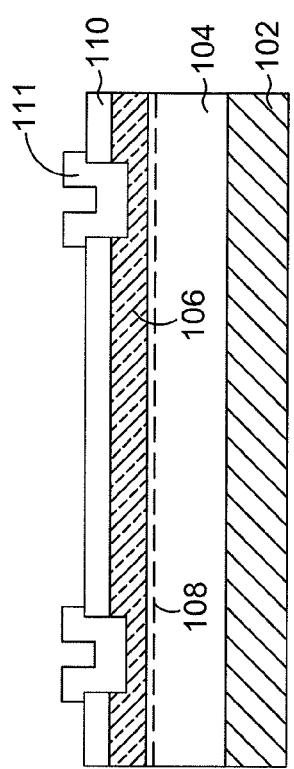
Figure 14:
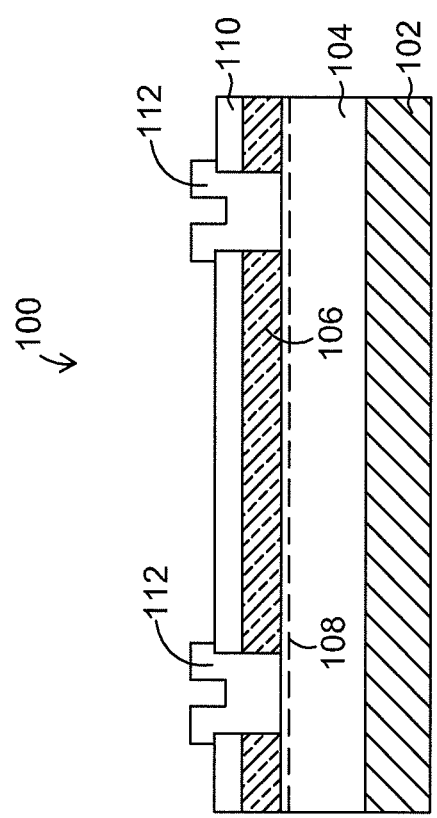

FIGS. 12 to 14 are cross-sectional views at various stages of manufacture according to various embodiments of the method 300 of FIG. 3. Specially, the operation 303 associated with FIGS. 4 to 6 are shown according to a different embodiment in FIGS. 12 to 14.

In FIG. 12, openings 109 of the dielectric cap layer 110 are formed through suitable photolithographic and etching processes to expose portions of a top surface 107 of the second III-V compound layer 106. Then, the exposed portions of the second III-V compound layer 106 through the openings 109 are removed by a suitable process such as reactive ion etching (RIE) in order to form a recess within each opening 109 in the second III-V compound layer 106 (namely AlN layer 106). In at least one embodiment, the AlN layer 106 is etched with a plasma process, e.g., chlorine ($Cl_2$) environment. In at least another embodiment, the AlN layer 106 is removed with an argon (Ar) sputtering process. In at least one example, the recess extends to a depth D from about 10% to 100% of a thickness of the second III-V compound layer 106. In at least another example, the recess further extends into the first III-V compound layer 104 (namely GaN layer 104). A depth of the recess in the second III-V compound layer 106 and the first III-V compound layer 104 is from about 100% to 190% of a thickness of the second III-V compound layer 106. It is believed that the recess etching process on the second III-V compound layer 106 in the plasma environment creates nitrogen (N) vacancies in the second III-V compound layer 106 and the first III-V compound layer 104. The N vacancies increase carries so that the electrical performances for the device are improved.

In FIG. 13, a metal layer is deposited over the dielectric cap layer 110, disposed over the interior surface of the openings 109 and the recesses, and contacts a bottom surface of the recess. A photoresist layer (not shown) is formed over the metal layer and developed to form a feature over the openings 109. The metal layer not covered by the feature of the photoresist layer is removed by a reactive ion etch (RIE) process that etches the exposed portions of the metal layer down to the underlying the dielectric cap layer 110. Metal features 111 are generated by etching process. The photoresist layer is removed after the formation of the metal features 111. The metal features 111 are at least partially embedded in the recess of the second III-V compound layer 106 and the dielectric cap layer 110.

In FIG. 14, a thermal annealing process is performed on the metal features 111, such that each metal feature 111, the second III-V compound layer 106 and the first III-V compound layer 104 react to form an intermetallic compound 112. Advantageously, the recess formation reduces the remaining thickness of the second III-V compound layer 106 after the recess etching process. In some embodiments, the metal elements in the intermetallic compound 112 formed in this annealing process diffuse deeper into the second III-V compound layer 106 and the first III-V compound layer 104. In some embodiments, the intermetallic compound 112 improves electrical connection and forms ohmic contacts between the source/drain features and the carrier channel 108.

Various embodiments of the present disclosure are used to improve the performance of a semiconductor structure having a high electron mobility transistor (HEMT). For example, in conventional methods, a portion of the second III-V compound layer 106 is etched to form a recess for the gate formation of an enhanced-mode HEMT. During etching the recess, the etching uniformity among the semiconductor chip regions on the same substrate 102 is hard to control. The electrical performances of each HEMT in the same semiconductor chip region or the same substrate 102 is not accurately controlled. In this disclosure, the p-type layer 120 on the second III-V compound layer 106 depletes the electrons in the carrier channel 108 for an enhanced-mode HEMT. The p-type layer 120 in each opening 118 among the semiconductor chip regions on the same substrate 102 is uniformly formed. The p-type layer 120 eliminates the drawbacks in conventional methods. The p-type layer 120 also acts as gate insulator to provide a lower gate leakage of the HEMT in the structure 100. The intermetallic compound 112 is free of Au and comprises Al, Ti or Cu. Without using Au in the intermetallic compound 112, the method 300 is implemented in the production line of integrated circuits on silicon substrate, because the contamination concern from Au on the silicon-Fab process is eliminated. Compared with the HEMT having Au in source/drain feature, the cost for manufacturing the HEMT according to the present application is reduced. Both the III-V semiconductor compounds process and the silicon-fabrication process are implemented in the same production line, which increases the flexibility to allocate different products for the production line.

One aspect of this disclosure describes a method of forming a high electron mobility transistor (HEMT). The method includes forming a second III-V compound layer on a first III-V compound layer, forming a source feature and a drain feature on the second III-V compound layer, depositing a p-type layer on a portion of the second III-V compound layer between the source feature and the drain feature, and forming a gate electrode on the p-type layer. A carrier channel is located between the first III-V compound layer and the second III-V compound layer.

Another aspect of this disclosure describes a method of forming a high electron mobility transistor (HEMT). The method includes epitaxially growing a second III-V compound layer on a first III-V compound layer, forming two metal features spaced apart and disposed on the second III-V compound layer, annealing the two metal features to form corresponding intermetallic compounds, depositing a p-type layer on a portion of the second III-V compound layer between the intermetallic compounds, and forming a gate electrode on the portion of the p-type layer. Each metal feature is free of Au and comprises Al, Ti or Cu. A carrier channel is located between the first III-V compound layer and the second III-V compound layer.

The present disclosure also describes an aspect of a method of forming a high electron mobility transistor (HEMT). The method includes forming a second III-V compound layer on a first III-V compound layer, forming a dielectric cap layer on the second III-V compound layer, forming a source feature and a drain feature on the second III-V compound layer, forming a protection layer on the dielectric cap layer, depositing a p-type layer on a portion of the second III-V compound layer, a portion of the dielectric cap layer and a portion of the protection layer, and forming a gate electrode on the p-type layer. A carrier channel is located between the first III-V compound layer and the second III-V compound layer. The source feature and the drain feature are free of Au. The p-type layer is disposed between the source feature and the drain feature.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a high electron mobility transistor (HEMT), the method comprising:
    forming a second III-V compound layer on a first III-V compound layer, wherein a carrier channel is located between the first III-V compound layer and the second III-V compound layer;
    forming a dielectric cap layer on the second III-V compound layer;
    forming a source feature and a drain feature on the second III-V compound layer, wherein at least one of the source feature or the drain feature extends into the second III-V compound layer;
    forming a protection layer on the dielectric cap layer;
    after forming the protection layer on the dielectric cap layer, depositing a p-type layer on a portion of the second III-V compound layer, a portion of the dielectric cap layer and a portion of the protection layer; and
    forming a gate electrode on the p-type layer.

2. The method of claim 1, wherein the p-type layer comprises $NiO_x$, $ZnO_x$, $FeO_x$, $SnO_x$, $CuAlO_2$, $CuGaO_2$ or $SrCu_2O_2$.

3. The method of claim 1, further comprising forming one or more isolation regions in the first III-V compound layer and the second III-V compound layer.

4. The method of claim 1, wherein the gate electrode comprises titanium (Ti), titanium nitride (TiN), titanium tungsten (TiW), titanium tungsten nitride (TiWN), tungsten (W) or tungsten nitride (WN).

5. The method of claim 1, wherein the source feature and the drain feature are embedded in the second III-V compound layer and a top portion of the first III-V compound layer.

6. The method of claim 1, further comprising patterning the dielectric cap layer to expose the portion of the second III-V compound layer.

7. The method of claim 1, wherein forming the protection layer on the dielectric cap layer includes forming the protection layer directly on the source feature and the drain feature such that the protection layer physically contacts the source feature and the drain feature.

8. The method of claim 1, wherein depositing the p-type layer comprises treating the p-type layer with a plurality of dopants including phosphorous (P), $P_2O_5$, arsenic (As) or $Zn_3As_2$.

9. The method of claim 8, further comprising performing an annealing step at a temperature ranging from about 600° C. to about 900° C. in a nitrogen environment.

10. A method of forming a high electron mobility transistor (HEMT), the method comprising:
    epitaxially growing a second III-V compound layer on a first III-V compound layer, wherein a carrier channel is located between the first III-V compound layer and the second III-V compound layer;
    depositing a dielectric layer over the second III-V compound layer;
    forming two metal features spaced apart and disposed on the second III-V compound layer, wherein each metal feature is free of Au and comprises Al, Ti or Cu, and each metal feature extends along a top surface of the dielectric layer;
    annealing the two metal features to form corresponding intermetallic compounds;
    depositing a protection layer on the dielectric cap layer;
    depositing a p-type layer on a portion of the second III-V compound layer a portion of the dielectric layer and a portion of the protection layer; and
    forming a gate electrode on the portion of the p-type layer.

11. The method of claim 10, wherein the p-type layer comprises at least one metal oxide.

12. The method of claim 10, wherein the p-type layer comprises at least one oxide of Ni, Zn, Fe, Sn, Cu, Al, Ga, Sr and mixtures thereof.

13. The method of claim 10, wherein the p-type layer comprises a plurality of dopants including phosphorous (P), $P_2O_5$, arsenic (As) or $Zn_3As_2$.

14. The method of claim 10, wherein annealing the two metal features comprises performing a rapid thermal anneal at a temperature ranging from about 800° C. to about 1100° C.

15. The method of claim 10, wherein the p-type layer is configured to elevate a conductance band $E_c$ at an interface of the first III-V compound layer and the second III-V compound layer to a level higher than a Fermi level $E_f$ at the interface of the first III-V compound layer and the second III-V compound layer.

16. A method of forming a high electron mobility transistor (HEMT), the method comprising:
    forming a second III-V compound layer on a first III-V compound layer, wherein a carrier channel is located between the first III-V compound layer and the second III-V compound layer;
    forming a dielectric cap layer on the second III-V compound layer;
    forming a source feature and a drain feature on the second III-V compound layer, wherein the source feature and the drain feature are free of Au;
    forming a protection layer on the dielectric cap layer;
    depositing a p-type layer on a portion of the second III-V compound layer, a portion of the dielectric cap layer and a portion of the protection layer, wherein the p-type layer is disposed between the source feature and the drain feature; and
    forming a gate electrode on the p-type layer.

17. The method of claim 16, wherein forming the source feature and the drain feature comprises:
    forming two openings in the dielectric cap layer to expose a portion of the second III-V compound layer, wherein the two openings are spaced apart; and
    forming a metal feature in each of the openings, wherein each metal feature is free of Au and comprises Al, Ti or Cu.

18. The method of claim 17, further comprising forming intermetallic compounds from at least the metal features, wherein the intermetallic compounds are at least partially embedded in each of the openings.

19. The method of claim 18, wherein forming the intermetallic compounds comprises performing a rapid thermal anneal on the metal features at a temperature ranging from about 800° C. to about 1100° C.

20. The method of claim 17, wherein forming the two openings in the dielectric cap layer further comprises forming two openings in the second III-V compound layer to expose a portion of the first III-V compound layer, and the intermetallic compounds partially extend into the first III-V compound layer.

* * * * *